United States Patent [19]

Fujisawa et al.

[11] Patent Number: 5,325,440
[45] Date of Patent: Jun. 28, 1994

[54] LOUDNESS CONTROL CIRCUIT

[75] Inventors: Masanori Fujisawa, Kumagaya; Hiroshi Kojima, Ooizumi, both of Japan

[73] Assignee: Sanyo Electric Co., Ltd., Osaka, Japan

[21] Appl. No.: 47,014

[22] Filed: Apr. 14, 1993

Related U.S. Application Data

[63] Continuation of Ser. No. 751,012, Aug. 28, 1991, abandoned.

[30] Foreign Application Priority Data

Aug. 30, 1990 [JP] Japan .................. 2-230436

[51] Int. Cl.⁵ .................................. H03G 9/00
[52] U.S. Cl. .......................... 381/102; 381/27; 381/98
[58] Field of Search .................. 381/27, 98, 102

[56] References Cited

U.S. PATENT DOCUMENTS

| | | | |
|---|---|---|---|
| 3,944,941 | 3/1976 | Tsuda | 381/24 |
| 4,186,273 | 1/1980 | Dodson | 381/28 |
| 4,891,841 | 1/1990 | Bohn | 381/98 |
| 4,982,435 | 1/1991 | Kato et al. | |

OTHER PUBLICATIONS

Linear Applications, vol. 1, Byerly and Kooi Dec. 1972, p. AN69-6.

Primary Examiner—John K. Peng
Assistant Examiner—Edward Lefkowitz
Attorney, Agent, or Firm—Armstrong, Westerman, Hattori, McLeland & Naughton

[57] ABSTRACT

A loudness control circuit emphasizes low frequency components in audio signals. A secondary low-pass filter select low frequency components of the audio signals, inverting a phase of the audio signals. The phase-inverted signals and audio signals are respectively inputted to an inverting input terminal and non-inverting input terminal of an operational amplifier to obtain audio signals whose low frequency components are emphasized. These signals have the same phase as the phase of the inputted audio signals. The output of the low-pass filter is amplified to obtain a signal having low frequency components whose phase is inverted. Both the audio signal whose low frequency components have been amplified and the low frequency components whose phase has been inverted are applied to a speaker to reproduce sounds with their low frequency components dynamically emphasized.

10 Claims, 1 Drawing Sheet

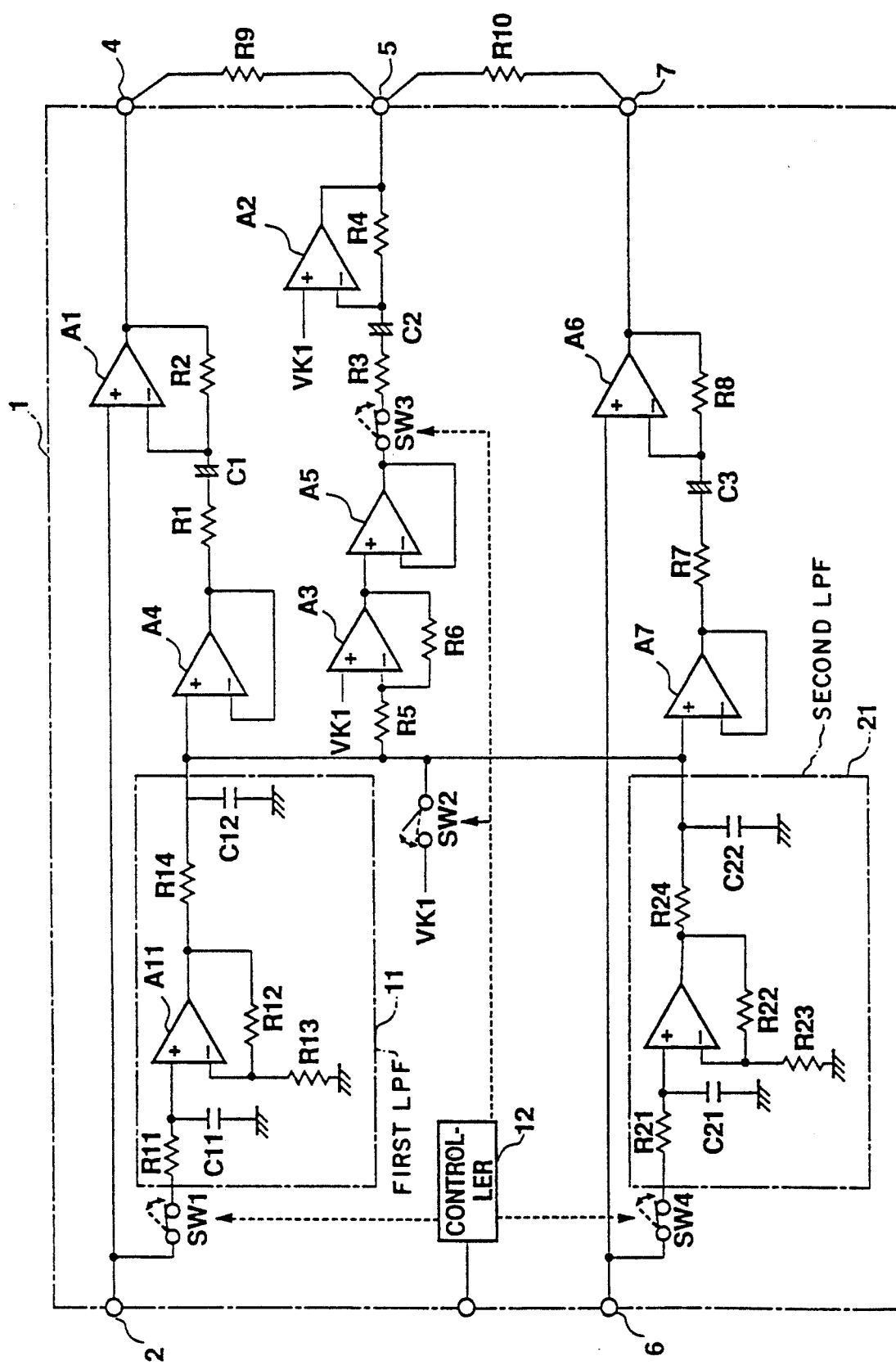

LOUDNESS CONTROL CIRCUIT

This application is a continuation of application Ser. No. 07/751,012 filed Aug. 28, 1991, now abandoned.

BACKGROUND OF THE INVENTION

1. Field of the Invention:

This invention relates to a loudness control circuit for amplifying audio signals by emphasizing their low frequency components.

2. Description of the Related Art:

There are currently known a number of audio signal reproducing systems such as tape recorders, CD players and radio receivers. With these reproducing systems, amplification factors are sometimes adjusted for every frequency band, thereby changing the tone qualities to the listener's taste.

Portable reproducing systems are very popular. However, such portable reproducing system output sounds via a small headphone, and often suffer from insufficient low frequency tones because the system is very compact. In U.S. Pat. No. 4,982,435, the present inventor(s) has proposed a loudness control circuit which can emphasize low frequency components in such small portable reproducing system. With this system, only low frequency components are selected by low-pass filters, amplified, and reconstituted with audio signals from the entire frequency bands to emphasize the low frequency components.

Since it is usually operated by batteries and includes integrated circuits, the portable reproducing system cannot receive a large power supply voltage. Therefore, it is very difficult for a conventional loudness control circuit to amplify the low frequency components over a sufficient dynamic range.

SUMMARY OF THE INVENTION

It is therefore an object of this invention to provide a loudness control circuit which can assure a sufficient dynamic range through the use of a simple circuit and emphasize the low frequency components of an audio signal.

According to this invention, there is provided a loudness control circuit comprising: a first signal input terminal adapted to receive audio signals; a first low-pass filter adapted to pass low frequency components of the audio signals from the signal input terminal and to reverse the phase of the audio signals; a first amplifier adapted to amplify audio signals from the first signal input terminal, phase reverse and amplify the output signal from the first low-pass filter, and transmit the amplified signals; a first output terminal adapted to transmit the output signal from the first amplifier; a second amplifier adapted to amplify the output signals from the first low-pass filter; and a second output terminal adapted to transmit the output signals for the second amplifier.

With this arrangement, the first low-pass filter picks out low frequency components from audio signals, amplifies them and reverses their phase. The first amplifier adds and amplifies, in the same phase, the audio signals of the entire audio frequency band and the amplified low frequency components. Thus, all-frequency-band audio signals including the emphasized low frequency components are obtained. The second amplifier obtains the signals having a phase opposite to the phase of the audio signals and including only amplified low frequency components. These two signals are applied to opposite ends of a speaker, thereby performing BTL (balanced transformerless) amplification of the low frequency components. BTL amplification operated by applying signals at positive and negative sides of a central potential and thus enlarges the dynamic range. Therefore, the low frequency components can be amplified in a very large dynamic range. Since the output dynamic range can be enlarged for the low frequency components, the signal to noise ratio can also be improved.

The first amplifier is an operational amplifier in which the audio signals from the first input terminal are inputted to a non-inverting input terminal and the signals from the first low-pass filter are inputted to the inverting input terminal.

The first low-pass filter preferably includes two capacitors for conducting high frequency components to ground in order to attenuate them and to reverse the phase of the low frequency components.

It is preferable that the loudness control circuit includes a first switch for supplying and stopping the audio signals from the first input terminal to the first low-pass filter, and a second switch for supplying and stopping a reference voltage signal to an input path of the second amplifier.

Low frequency tones can be intensified while the first switch is on and the second switch si off. When the first switch is turned off and second switch is turned on, amplification by the first amplifier is at a constant gain across the whole frequency band, so that only DC components corresponding to the reference voltage can be outputted. Thus, a normal output can be obtained without intensified low frequency components.

The second amplifier includes an operational amplifier in which the output from the first low-pass filter is inputted to the inverting input terminal, a reference voltage signal is inputted to a non-inverting input terminal, an output of the operation amplifier is inputted to the inverting input terminal via a third switch, and a reference voltage signal is inputted to the non-inverting input terminal. With this arrangement, either the low frequency components amplified by the second amplifier or the reference voltage signal can be selectively outputted.

The loudness control circuit further comprises: a second signal input terminal adapted to receive other audio signals composing a stereo signal with the audio signals from the first signal input terminal; a second low-pass filter adapted to a pass low frequency components of the audio signals inputted via the second signal input terminal and to reverse a phase of these audio signals; a third amplifier adapted to amplify the audio signal from the second signal input terminal, to phase reverse and amplify the output signal from the second low-pass filter, and to output amplified signals; and a third output terminal adapted to transmit the output signals of the third amplifier. Therefore, BTL amplification can be performed for the low frequency components in the stereo signal as well as in the monaueal signal.

The audio signals inputted from the second input terminal can be processed in a similar manner to the audio signals inputted from the first input terminal.

BRIEF DESCRIPTION OF THE DRAWING

FIG. 1 is a block diagram showing a preferred loudness control circuit according to one embodiment of this invention.

DETAILED DESCRIPTION OF THE PREFERRED EMBODIMENTS

As shown in FIG. 1, a loudness control circuit 1 mainly comprises operation amplifiers A1 to A7 (A4, A5, A7 serving as buffer amplifiers), low-pass filters 11, 21, and switches SW1, SW2, SW3, SW4.

The low-pass filters 11, 21 each include a pair of capacitors C11, C12, and C21, C22, respectively.

An audio signal input terminal 2 is connected to a positive input terminal (non-inverting input terminal) of the amplifier A1 and an input terminal of the switch SW1. The output terminal of the amplifier A1 is connected to its negative input terminal (inverting input terminal) via a resistor R2.

The output terminal of the switch SW1 is connected to an input terminal of the low-pass filter 11 which passes only low frequencies and shifts their phase by 180 degrees. The output terminal of the low-pass filter 11 is connected to the positive input terminal of the buffer amplifier A4. The output terminal of the buffer amplifier A4 is connected to the negative input terminal of the amplifier A1 via the negative input terminal of the amplifier A4, the resistor R1 and the capacitor C1.

The low-pass filter 11 includes resistors R11 to R14, capacitors C11, C12, and an amplifier A11. An input terminal of the amplifier A11 is connected to a switch SW1 via a resistor R11 and to the capacitor C11 which is grounded. The output terminal of the amplifier A11 is connected to the positive input terminal of a buffer amplifier A4 via a resistor R14, ad to the negative input terminal of the amplifier A11 via a feedback resistor R12. An adjusting resistor R13 one end of which si grounded, is connected to the negative input terminal of the amplifier A11.

As described above, the low-pass filter 11 has the two capacitors C11, C12 for conducting AC signals to ground to in order attenuate certain high frequency signals, and severs as a secondary filter for shifting the phase of an input signal by 180 degrees. It is preferably that the low-pass filters 11, 21 have a cut-off frequency of about 20 Hz.

The negative input terminal of an amplifier A3 is connected to the output terminal of the low-pass filter 11. A reference voltage Vk1 is supplied to the positive input terminal of the amplifier A3. The output terminal of the amplifier A3 is connected to its own positive input terminal via a feedback resistor R6.

The output terminal of the amplifier A3 is connected to the positive input terminal of the buffer amplifier A5. The output terminal and the negative input terminal of the amplifier A5 are connected together. The output terminal of the amplifier A5 is connected to the input terminal of the switch SW3. The output terminal of the switch SW3 is connected to the negative input terminal of the amplifier A2 via the resistor R3 and capacitor C2. The negative input terminal and the output terminal of amplifier A2 are connected together via a resistor R4. A reference voltage Vk1 is applied to the positive input terminal of the amplifier A2. The output terminal of the amplifier A2 is connected to a second output terminal 5.

A select signal input terminal 3 is connected to the control input terminal of a controller 12. A control output terminal of the controller 12 is connected to the control input terminals of the switches SW1, SW2, SW3, SW4.

A second audio signal input terminal 6 is connected to the positive input terminal of the amplifier A6, also being connected to the low-pass filter 21 via the switch SW4. The output terminal of the low-pass filter 21 is connected to the negative input terminal of the amplifier A6 via a buffer amplifier A7, a resistor R7 and a capacitor C3. The negative input terminal of the amplifier A6 is connected to its output terminal via a feedback resistor R8. The output terminal of the amplifier A6 is connected to a third output terminal 7.

The audio signal input terminals 2, 6 receive left and right channel signals of the stereo audio signals, respectively. A load resistor R9 as a speaker for one of the two channels is connected between the output terminals 4, 5. Another load resistor R10 as a speaker for the other channel is connected between the output terminals 7, 5. A signal indicating necessity or non-necessity to augment bass is supplied to a select signal input terminal 3.

The left and right channel audio signals inputted to the input terminals 2, 6 are amplified by the amplifiers A1, A6, being transmitted from the output terminals 4, 7. The switches SW1 to SW4 perform control according to the control signal "H" to "L" inputted to the control 12. Operations related to the audio signals from the terminals 2, 6 to the terminals 4, 7, respectively, are identical except for the input signals. Therefore, the operation related to the signals between the terminals 2 and 4 will be exemplified.

An ordinary amplification (without bass emphasis) is performed to uniformly amplify audio signals throughout the entire frequency bands. As indicated by broken lines in FIG. 1, the switch SW1 is open, SW2 is closed, and SW3 is open.

Since the switch SW1 is open, no audio signal is applied to the low-pass filter 11. The switch SW2 is closed, applying the reference voltage Vk1 to the buffer amplifier A4. An output voltage Vk1 of the buffer amplifier A4 is applied to one end of the resistor R1.

The amplifier A1 amplifies the audio signals inputted from the terminal 2 at an amplification factor determined by the ratio of the resistor R2 to the resistor R1, outputting the amplified signal t the first output terminal 4.

Since the switch SW3 is open, the amplifier A2 is a voltage follower to function as a buffer amplifier. An output DC voltage of the amplifier A2 is equivalent to an output DC voltage of the amplifier A1. An output impedance of the amplifier A2 is lowered. Therefore, no DC current flows to the load resistor R7 between the output terminals of the amplifiers A1, A2, but only an AC output signal obtained data the output terminal of the amplifier A1 is applied to the load resistor R7. since the amplifier A1 does not have any frequency characteristics, the output signal of the amplifier A1 has a flat frequency characteristic.

The signal outputted from the terminal 6 is similarly processed, and is outputted from the terminal 7. The reference voltage Vk1 is applied to the amplifier A7 via the switch SW2.

Operation for emphasizing bass will be described hereinafter.

As indicated by solid lines in FIG. 1, a control signal from the controller 12 keeps the switch SW1 closed, switch SW2 open and switch SW3 closed.

The low frequency components of the audio signals applied to the terminal 2 pass through the low pass filer 11, and are reversed by 180 degrees, being applied to the buffer amplifier A4 and amplifier A3.

The phase-shifted low frequency audio signal applied t the buffer amplifier A4 is inputted to the negative input terminal of the amplifier A1 via the resistor R1 and capacitor C1.

The amplifier A1 amplifies the audio signal applied to the positive input terminal and the phase-shifted low frequency signal applied to the negative terminal according to the amplification factor determined by the ratio between the resistors R2 and R1. Therefore, the first output terminal 4 receives all-frequency-band audio signals, whose phase is the same as the phase of the inputted audio signals and which include emphasized low frequency bands.

On the other hand, the amplifier A3 further reverses the phase-inverted low frequency audio signal, restores the signal phase to eh original signal phase, amplifies the signal according to the amplification factor determined by the ratio between the resistors R6, R5, and outputs the signal to the buffer amplifier A5.

An output signal of the buffer amplifier A5 is inputted to the inverting input terminal of the amplifier A2 via the switch SW3, the resistor R3 and the capacitor C2.

The amplifier A2 reverses the input signal again, amplifying the signal by the amplification factor determined by the ratio between the resistors R4, R3, and transmitting the signal to the second output terminal 5.

The all-frequency-band audio signals at the first output terminal 4 are applied to the load resistor R9. The low frequency audio signal at the first output terminal 4 has a phase opposite to the phase of the low frequency band audio signal t the second output terminal 5. These low frequency band audio signals are applied to the load resistor R9 for the purpose of BTL amplification.

Therefore, the low-frequency-band audio signals are four times as powerful as the all-frequency-band audio signals, thereby emphasizing bass.

The signal inputted from the terminal 6 is similarly processed to be outputted from the terminal 7. The output of the low-pass filter 21 is applied to the amplifier A3 with the output of the low-pass filter 11.

By emphasizing bass extensively, a listener can enjoy very powerful sounds with vivid bass even via small speakers of a headphone. Since BTL (balanced (transformerless) amplification is employed in the loudness control circuit to emphasize low frequency bands, the power supply voltage can be maintained low but the dynamic range can be enlarged. The control circuit is set in motion by a low power supply voltage, being advantageously applicable to reproducing systems including integrated circuits.

As shown in FIG. 1, the outputs of the low-pass filters 11, 12 are inputted to the negative signal input terminal of the amplifier A3. Since the bass components are substantially identical in the left and right channels of the stereo audio signals, the output of only one low-pass filter may be inputted to the amplifier A3.

What is claimed is:

1. A loudness control circuit for controlling boost of low frequency components of an audio signal, comprising:
    (a) a first signal input terminal for receiving audio signals ;
    (b) a first low-pass filter for passing low frequency components of the audio signals from said signal input terminal and for inverting a phase of the low frequency components of the audio signals;
    (c) a first amplifier for amplifying the audio signal from said first signal input terminal, inverting and amplifying output signals from said first low-pass filer, and transmitting amplified signals;
    (d) a first output terminal for connecting to a first terminal of a load and for transmitting the output signals from said first amplifier;
    (e) a second amplifier for performing non-inverting amplification of the output signal from said first low-pass filter; and
    (f) a second output terminal for connecting to a second terminal of the load and for transmitting the output signals from said second amplifier,
    wherein the low frequency components are amplified and applied to the first and second terminals of the load in a balanced transformerless (BTL) mode while the rest of the frequency components of the audio signal are applied to the first and second terminals of the load in a non-BTL mode.

2. A loudness control circuit according to claim 1, wherein said first amplifier is an operation amplifier in which the audio signal from said fist input terminal are inputted to a non-inverting input terminal and the signals from said first low-pass filter are inputted to a inverting input terminal.

3. A loudness control circuit according to claim 2, wherein said first low-pass filter includes tow capacitors for conducting high frequency components to the ground to attenuate them and to invert a phase of low frequency components.

4. A loudness control circuit according to claim 3, further comprising from said first input terminal to said first low-pass filter, and a second switch for supplying and stopping a reference voltage signal to an input path of said second amplifier.

5. A loudness control circuit according to claim 4, wherein said second amplifier includes first and second operational amplifiers in which the output from said first low-pass is inputted to an inverting input terminal of said first operation amplifier, a reference voltage signal is inputted to a non-inverting input terminal of said first operational amplifier, an output of said first operational amplifier is inputted to an inverting input terminal at said second operational amplifier via a third switch, and a reference voltage signal is inputted to a non-inverting input terminal of said second operational amplifier.

6. A loudness control circuit according to claim 1, further comprising:
    (a) a second signal input terminal for receiving other audio signal composing a stereo signal with the audio signal inputted via said first signal input terminal;
    (b) a second low-pass filter for passing low frequency components of the audio signals from said second signal input terminal and for inverting a phase of these audio signals;
    (c) a third amplifier for amplifying the audio signal from said second signal input terminal, for inverting and amplifying the output signal from said second low-pass filter, and for transmitting amplified signals; and
    (d) a third output terminal for transmitting the output signals for said third amplifier.

7. A loudness control circuit according to claim 6, wherein said fist amplifier is an operation amplifier in which the audio signals for said first signal input terminal are received by a non-inverting input terminal and the signal from said first low-pass filter are received by an inverting input terminal, and said third amplifier is an operational amplifier in which the audio signals from said second signal input terminal are received by a non-inverting input terminal and the signals from said second low-pass filter are received by an inverting input terminal.

8. A loudness control circuit according to claim 7, wherein said first and second low-pass filters respectively include two capacitors for conducting high frequency components to the ground to attenuate them and to invert the phase of low frequency components.

9. A loudness control circuit according to claim 8, further including a first switch for supplying and stopping the audio signal from said first input terminal to said first low-pass filter, a second switch for supplying and stopping the audio signal from said second input terminal to said second low-pass filter, and a third switch for supplying and stopping the reference voltage signal to an input path of said second amplifier.

10. A loudness control circuit according to claim 7, wherein said second amplifier includes a first operational amplifier in which the output from said first low-pass filter is received by an inverting input terminal and the reference voltage signal is received by a non-inverting input terminal, and a second operational amplifier in which an output from said first operation amplifier is received by an inverting input terminal via a fourth switch and the reference voltage signal is received by a non-inverting input terminal.

* * * * *